(12) United States Patent
Berthold et al.

(10) Patent No.: US 7,932,542 B2
(45) Date of Patent: Apr. 26, 2011

(54) METHOD OF FABRICATING AN INTEGRATED CIRCUIT WITH STRESS ENHANCEMENT

(75) Inventors: Joerg Berthold, Munich (DE); Winfried Kamp, Munich (DE); Fritz Rothacher, Augsburg (CH)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/860,413

(22) Filed: Sep. 24, 2007

(65) Prior Publication Data
US 2009/0079023 A1   Mar. 26, 2009

(51) Int. Cl.
*H01L 27/118* (2006.01)

(52) U.S. Cl. . 257/202; 257/638; 257/640; 257/E27.108; 438/740

(58) Field of Classification Search .......... 257/202, 257/203, 210, 374, 510, E27.105, E27.108, 257/E27.11, 638, 640; 438/17, 221, 740; 716/8, 9
See application file for complete search history.

(56) References Cited

U.S. PATENT DOCUMENTS

| | | | |
|---|---|---|---|
| 6,969,875 B2 | 11/2005 | Fitzgerald | |
| 7,045,408 B2 | 5/2006 | Hoffmann et al. | |
| 7,060,549 B1 | 6/2006 | Craig et al. | |
| 7,220,630 B2 | 5/2007 | Cheng et al. | |
| 7,307,273 B2 | 12/2007 | Currie | |
| 7,335,545 B2 | 2/2008 | Currie | |
| 7,411,253 B2 | 8/2008 | Shimizu et al. | |
| 7,462,554 B2 | 12/2008 | Huang et al. | |
| 7,488,670 B2 | 2/2009 | Knoefler et al. | |
| 7,504,704 B2 | 3/2009 | Currie et al. | |
| 7,531,393 B2 | 5/2009 | Doyle et al. | |
| 7,569,896 B2 | 8/2009 | Ko et al. | |
| 2005/0218455 A1* | 10/2005 | Maeda et al. | 257/368 |
| 2008/0142896 A1* | 6/2008 | Chen et al. | 257/369 |

* cited by examiner

*Primary Examiner* — Minh-Loan T Tran
(74) *Attorney, Agent, or Firm* — Dicke, Billig & Czaja, PLLC

(57) ABSTRACT

A method of fabricating an integrated circuit including arranging a plurality of cells to form a desired floor plan of the integrated circuit, wherein each cell comprises at least one transistor, forming a plurality of circuit constituents from the plurality of cells of the floor plan, wherein each circuit constituent comprises at least one cell and belongs to one of a plurality circuit constituent types, and applying mechanical stress to channel regions of the at least one transistor of each cell based on the circuit constituent type of the circuit constituent to which the cell belongs.

21 Claims, 9 Drawing Sheets

METHOD OF FABRICATING AN INTEGRATED CIRCUIT WITH STRESS ENHANCEMENT

BACKGROUND

Stress engineering techniques are employed to improve the performance of CMOS devices by applying a mechanical stress/strain to the channel region of FETs, with pFET devices requiring compressive stress and nFET devices requiring tensile stress. The applied stress enhances the mobility of the majority carriers (holes in pFET and electrons in nFET devices), enabling higher transistor drive currents and faster logic gate switching speeds.

Several techniques have been developed for applying the mechanical strain to the channel region of the FETs. One technique involves depositing a silicon-germanium alloy on top of active regions of the FETs, wherein the larger size of the germanium atoms results in a compressive strain in the channel region. A second technique involves deposition of an overlying layer of material having a different coefficient of thermal expansion as compared to the silicon and dielectric materials (e.g. silicon dioxide) employed for STI (shallow trench isolation) in the underlying substrate, with the difference in the coefficient of thermal expansion resulting in a transfer of a mechanical strain to the underlying substrate, including the channel regions.

In CMOS technology, process variations, such as variations in the gate length and channel doping of the transistors and in the line width of metal lines, for example, result in variations in the performance of the transistors. Such performance variations can adversely impact the performance of the integrated circuits. While stress engineering techniques, including those described above, improve transistor performance, the amount of strain introduced to a channel region depends on depends on the physical layout and construction of the underlying transistors and devices (e.g. logic gates). As such, due to the layout-dependent variations in the amount of strain achieved, stress engineering techniques can further increase device-to-device variations. Consequently, even though the performance of individual transistors and the speed of individual logic gates are improved, if the increased variations are not properly accounted for, the overall performance of the integrated circuit may be adversely impacted.

One technique employed to address such layout dependency is to extensively characterize the devices and/or logic gates of the integrated circuit. This is accomplished by designing appropriate test circuits and developing an extraction algorithm based on measured results obtained from these test circuits. However, for custom and semi-custom circuits, the huge number of possible combinations of standard cell arrangements which can be employed to form such circuits requires significant effort in terms of designing and measuring test structures. As such, extraction algorithms can become very complex and required long run-times during circuit verification. Additionally, if the stress application is subjected to changes of a fabrication process or varies due to an aging mechanism, even extensive circuit characterization will leave uncertainties and the performance of transistors and logic gates will vary correspondingly.

Another technique employed to address the layout dependency is to increase or widen safety margins used during the design process to account for the impact on the circuit by the increased variations. However, widening of the safety margins detracts from the performance improvement provided by strain engineering and still requires extensive characterization of the circuit and standard cell library.

SUMMARY

In one embodiment, a method of fabricating an integrated circuit is provided. The method includes arranging a plurality of cells to form a desired floor plan of the integrated circuit, each cell comprising at least one transistor, forming a plurality of circuit constituents from the plurality of cells of the floor plan, each circuit constituent comprising at least one cell and belonging to one of a plurality circuit constituent types, and applying mechanical stress to channel regions of the at least one transistor of each cell based on the circuit constituent type of the circuit constituent of which the cell is a part.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A method of fabricating an integrated circuit to provide improved stress enhancement is described herein. In one embodiment, the method includes arranging a plurality of cells to form a desired floor plan of the integrated circuit, each cell comprising at least one transistor, forming a plurality of circuit constituents from the plurality of cells of the floor plan, each circuit constituent comprising at least one cell and belonging to one of a plurality circuit constituent types, and applying mechanical stress to channel regions of the at least one transistor of each cell based on the circuit constituent type of the circuit constituent to which the cell belongs.

As will be described below, in one embodiment, applying the mechanical stress includes applying a stress liner at a first thickness over the cells of circuit constituents belonging to a first portion of the circuit constituent types, and at a second thickness over the cells of circuit constituents belonging to a second portion of the circuit constituent types. In one embodiment, the first portion of circuit constituent types comprises a clock distribution hardware constituent with the second thickness being greater than the first thickness. In one embodiment, the first thickness is substantially equal to zero (i.e. no stress enhancement).

Integrated circuits (ICs), including custom and semi-custom integrated circuits, are often formed by selecting and arranging standard cells from a cell library into a desired cell layout or "floor plan", which is subsequently interconnected or wired together so as to achieve a desired operation. Standard cells generally consist of a pre-designed layout of transistors interconnected to perform a desired function including, for example, combinatorial cells having one or more transistor gates configured to perform a particular function, cells configured as flip-flops, and clock buffer cells, to name a few.

Figure 1:
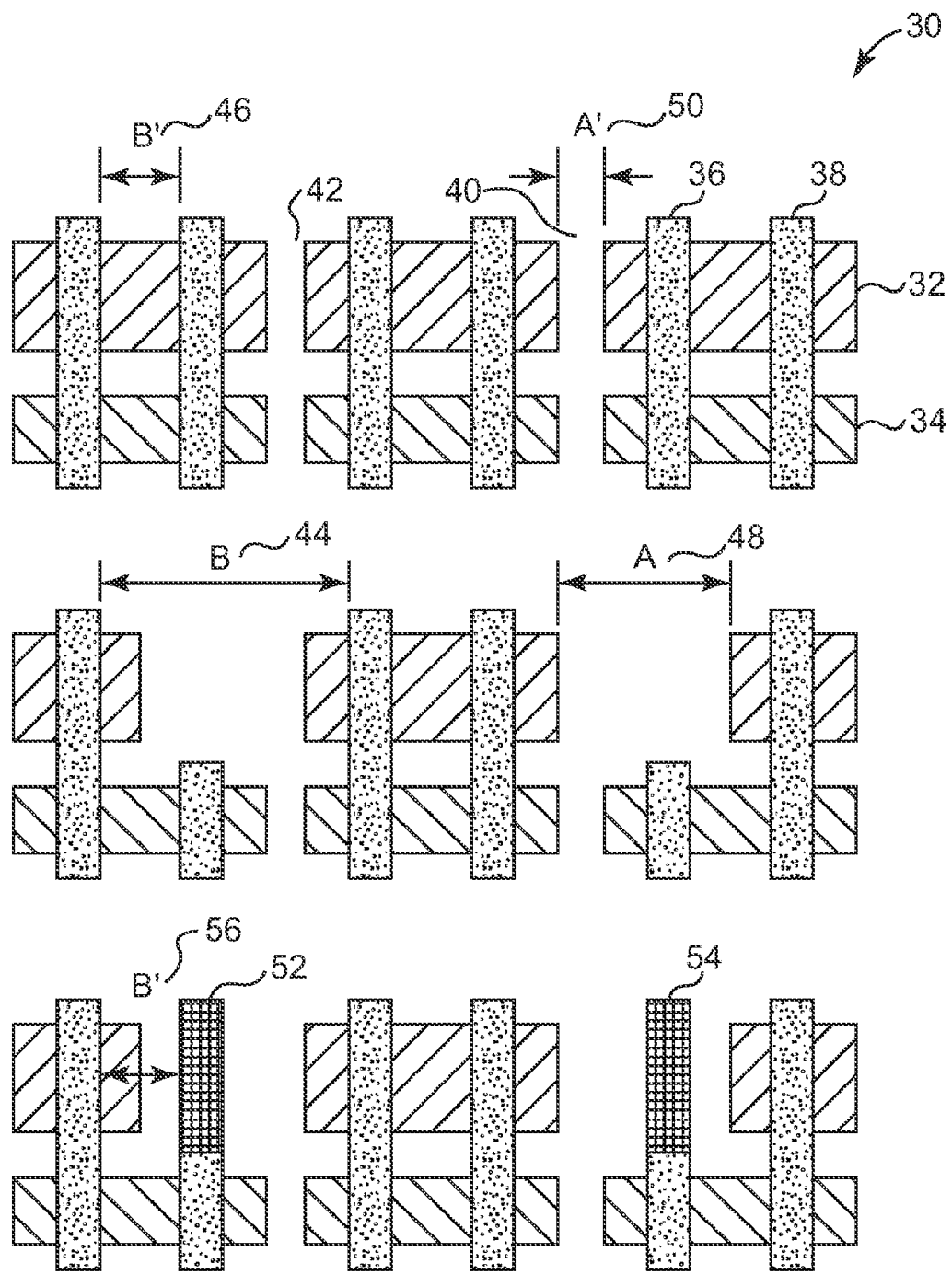
FIG. 1 is a block diagram illustrating examples of a transistor layouts in an integrated circuit.

FIG. 1 is a block diagram illustrating an example transistor layout for a portion of an integrated circuit 30. Active areas of transistors are represented by hatched areas and gates by filled areas, such as indicated by active areas 32, 34 and gates 36, 38. Areas between transistors, such as areas 40 and 42, represent isolation between transistors, such oxide-filled trenches constructed according to shallow trench isolation (STI) techniques, for example. As illustrated by FIG. 1, spacing between elements varies across the layout. For example, the gate pitch B between a pair of adjacent transistors, as illustrated at 44, is greater than gate pitch B' between another pair of adjacent transistors, as indicated at 46. Also, for example, the dimension or width A of the STI trench between one pair of transistors, as illustrated at 48, is greater that the width A' between another pair of transistors, as indicated at 50.

According to conventional manufacturing techniques, as described above, a stress layer or liner is often deposited over the IC to introduce a stress/strain in the channel regions of the underlying transistors in order to improve their drive currents and switching speeds of logic gates formed there from. However, the above described dimensional variations lead to variations in the amount of stress achieved in the channel regions of individual transistors by application of stress layers or liners, as described above. For example, the larger gate pitch B at 44 leads to greater stress at the channel regions of the adjacent transistors than at the channel regions adjacent to the lesser gate pitch B' at 46. Similarly, the larger STI width at 48 leads to greater stress at the channel regions of the adjacent transistors than at the channel regions adjacent to the lesser STI width at 50.

As a result of these varying amounts of stress, the improvement in performance resulting from the introduction of channel stresses varies from transistor-to-transistor, thereby introducing variations in transistor or gate performance in addition to those variations already present and due to other process factors (e.g. gate length and channel doping). As described above, these increased variations result in increased uncertainties in circuit performance, such as in path delays, for example, which detract from the performance improvement achievable via the stress engineering processes.

In some cases, the placement of additional structural element may provide a reduction in variations, such as gate pitch. For example, the introduction of additional poly silicon elements 52 and 54, indicated by the cross-hatched areas, maintains the gate pitch between gate structures at B', as indicated at 56. However, additional poly elements 52 and 54 increase the electrical load and lead to a high power dissipation, and together with other active area elements may form unwanted transistors.

In view of the above, according to embodiments described herein, a method of applying stress to an integrated circuit is described which provides increased performance improvements of the integrated circuit relative to conventional stress engineering processes.

As described above, integrated circuits, including custom and semi-custom logic circuits, are generally formed from standard cells. These cells are, in-turn, interconnected in a fashion so as to form several circuit constituents, such as critical paths, sub-critical paths, very short signal paths, and clock distribution hardware (e.g., buffers, inverters, gating cells), for example. Each of these several circuit constituents, due to various mechanisms (e.g. number and type of devices/gates, layout of transistors), have performance variations, including those introduced via stress engineering processes, which affect the performance of the integrated circuit in different ways. These circuit constituents are analyzed below and their impact on integrated circuit performance evaluated.

Figure 2:
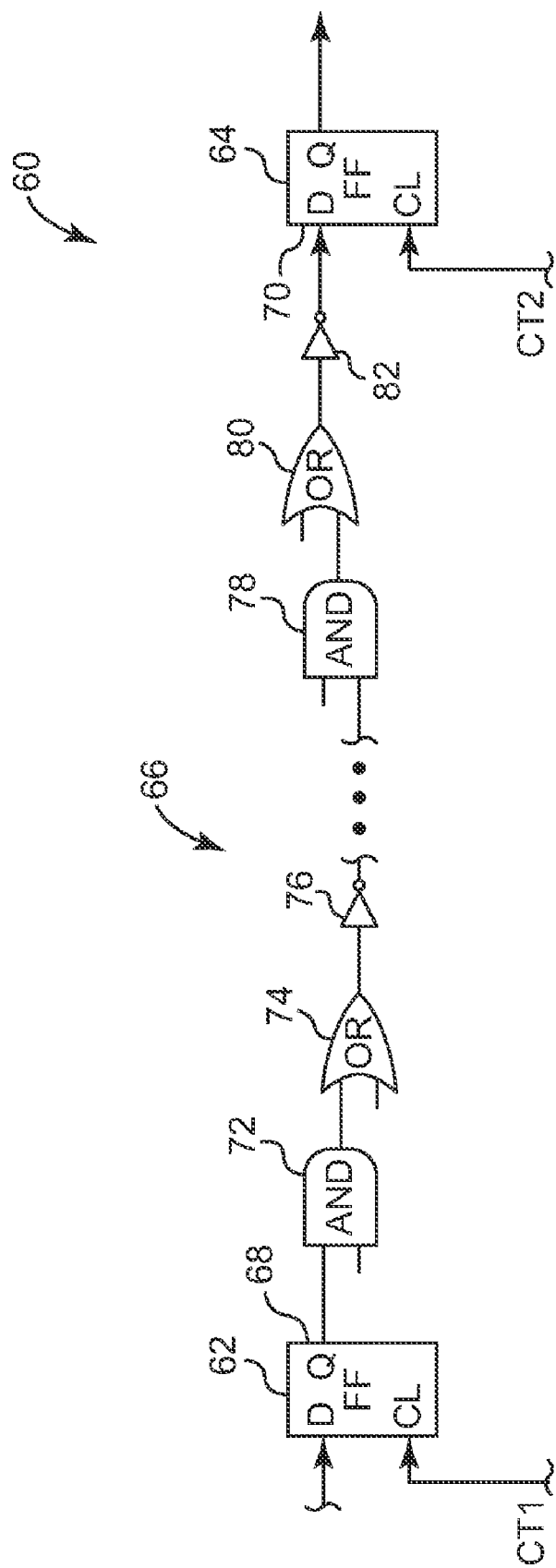
FIG. 2 is a schematic diagram illustrating an example of a critical path.

FIG. 2 is a schematic diagram illustrating an example of a critical path 60. Critical path 60 includes a launching register 62 (e.g. a flip-flop), a receiving register 64, and a plurality of combinatorial logic gates 66 respectively positioned between a data output Q 68 and a data input D 70 thereof. For critical paths, the number of combinatorial of plurality of combinational gates 66 may range from as few as four gates, for example, for a very high-performance IC, to as many as 40 gates, for example, for a low-to-medium performance IC. Here, for ease of illustration, only six elements of critical path 60 are illustrated in FIG. 2, the six elements being a first AND-gate 72, a first OR-gate 74, a first inverter, 76, a second AND-gate 78, a second OR-gate 80, and a second inverter 82.

Due to the various types of gates and devices (e.g. AND-gates, OR-gates, flip-flops, and inverters, to name a few) and to the different physical surroundings and layouts of the transistors forming these gates and devices (e.g. variations in gate pitch/length and STI dimensions), application of mechanical stress to cells forming the critical path (e.g. via application of a stress layer above the transistors) will impose differing amounts of stress among the transistors. As a result, while on-average the performance of each transistor and the switching speeds of each logical gate of the critical path will improve from introduction of the stress, the amount of improvement will vary between the gates.

Because of the large number of gates forming the critical path, there is a high probably that for each gate whose improvement in speed is sub-average by an amount, there is a gate whose improvement is super-average by approximately the same amount. This probability increases with increasing length of the critical path (i.e. increased number of gates, types of gates, and types of surround structures). This averaging mechanism is similar for each effect (e.g. gate pitch/length, STI dimensions, surrounding structure) and follows a Gaussian-like distribution. The averaging effect is similar to known variations in transistor threshold voltages (Vt), which follow the Gaussian distribution.

As a result of this averaging effect, it is apparent that the seemingly non-deterministic impact of additional performance variations caused by the application of stress leads, on a relative scale, to a smaller impact on path delay variations of longer paths, such as critical paths. In fact, the longer the path (i.e. the higher the number of gates in the path), the less the magnitude of any additional path delay variation which is attributable to the addition of the mechanical stress.

As a result, even though there is an increase in uncertainty in path delay, the above described averaging effect in longer paths leads to a relatively small impact in the critical path. The critical path constituents therefore benefit from the "average" improvement in performance provided by the application of the stress, leading to improvement in the performance of the integrated circuit.

Although not illustrated herein, sub-critical path constituents are similar to critical paths in that they include a launching and receiving flip-flop, but have a smaller number of combinatorial gates positioned there between. Because the path delay of sub-critical paths is less than that of critical paths (the delay of which, at least in part, determines the maximum operating frequency of the integrated circuit), any additional contributions to performance variations introduced to the flip-flops and combinatorial gates of the sub-critical paths has no impact on the performance of the integrated circuit.

Figure 3:
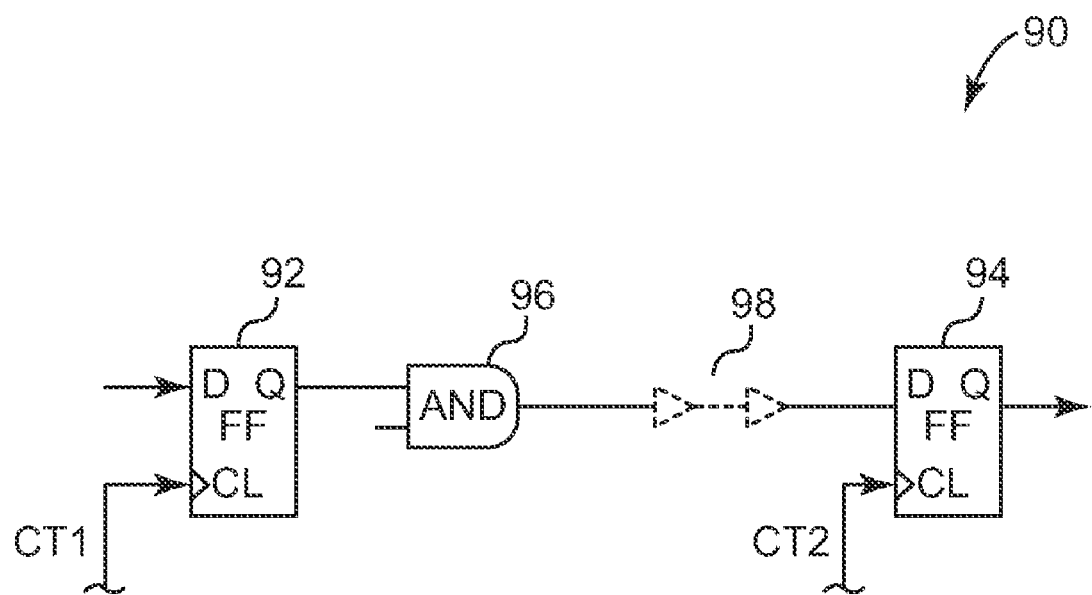
FIG. 3 is a schematic diagram illustrating an example of a very short signal path

FIG. 3 is a schematic diagram illustrating an example of a very short signal path 90. Very short signal path 90 includes a launching flip-flop 92 and a receiving flop-flop 94. Unlike critical paths, such as critical path 60 described above by FIG. 2, very short signal paths include one or no combinatorial gates positioned between the data output and inputs of the launching and receiving registers. As illustrated by FIG. 3, very short signal path 90 includes only AND-gate 96.

Very short signal paths, such as very short signal path 90, are subject to so-called hold-time violations (i.e. new data from launching flip-flop 92 arrives at receiving flip-flop 94 too early and appears at the output of receiving flip-flop 94 in a same clock cycle). One common approach to resolving such hold-time violations is to insert buffers into the path to introduce required path delays, such as buffers 98, indicated by the dashed lines in FIG. 3.

Here, any performance improvements to very short signal path 90 achieved via stress engineering processes would merely create or add to hold-time violations. Such a result is resolved by simply adding buffers as necessary to very short signal path 90. Buffers, such as buffers 98, lead to additional circuit area and increased power consumption, but do not compromise performance of the integrated circuit.

In view of the above, the application of stress via stress engineering techniques to the critical, sub-critical, and very short signal path constituents of integrated circuit 30 have either no adverse impact on or lead to improved performance of integrated circuit 30. However, as will be described below, the same is not true for clock hardware constituents.

Figure 4:
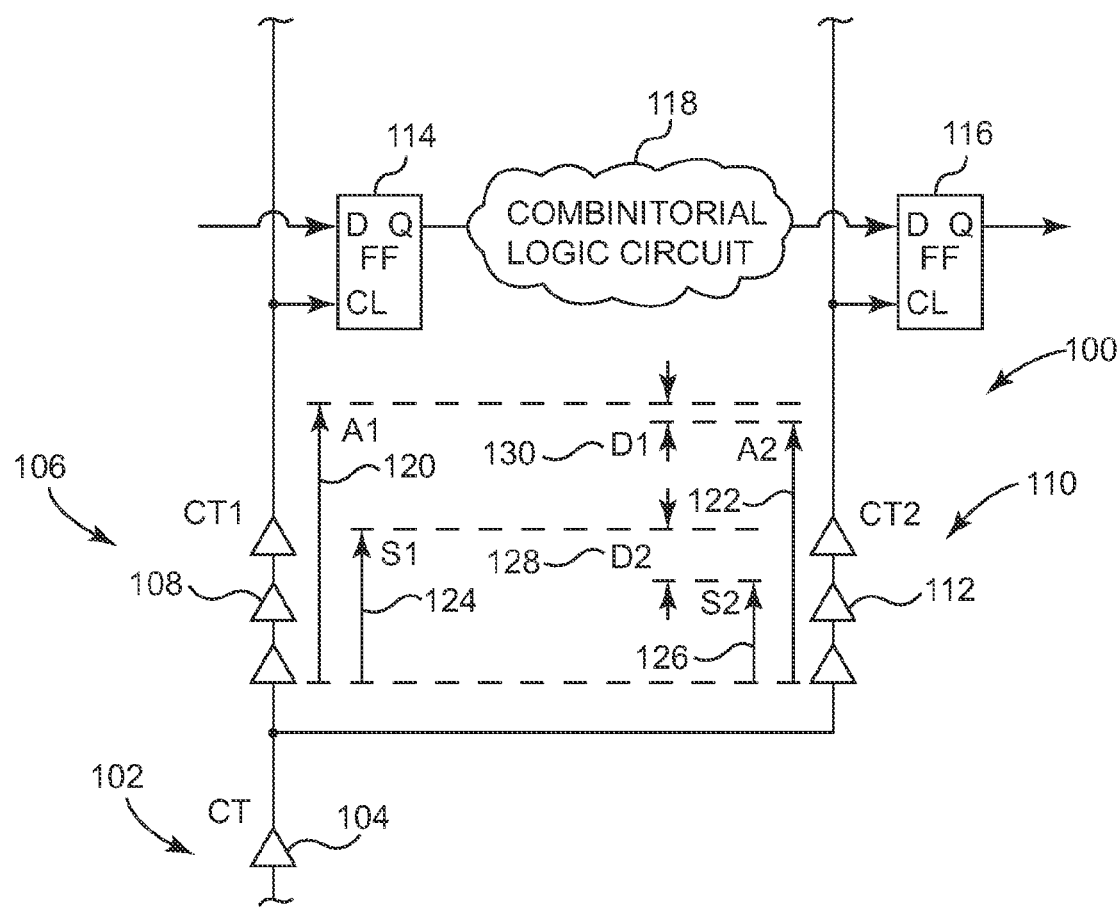
FIG. 4 is a schematic diagram illustrating an example of a portion of a clock distribution circuit

FIG. 4 is a schematic diagram illustrating an example of a portion of a clock distribution circuit 100. Clock distribution circuit 100 includes a first portion 102 having a clock buffer 104 and providing a clock signal CT, a first branch 106 including a plurality of clock buffers 108 and providing a first clock signal CT1, and a second branch 110 including a plurality of clock buffers 112 and providing a second clock signal CT2. As illustrated, first branch 106 and second branch 108 respectively provide clock signals CT1 and CT2 to a launching flip-flop 114 and a receiving flip-flop 116 of a circuit path, such as critical path 60, for example, and including a combinatorial logic circuit 118.

Because clock distribution hardware constituents, such as clock distribution circuit 100, include only a limited number of cell types and a small number of cells, the averaging effects described above by FIG. 2 with regard to critical path constituents do not occur with clock hardware constituents so that any additional performance variations introduced via strain engineering processes cause clock jitter.

Arrow "A1", as indicated at 120, represents the propagation delay of clock signal CT1 through first branch 106 and arrow "A2", as indicated at 122, represents the propagation delay of clock signal CT2 through second branch 110 without employing stress techniques. Similarly, arrow "S1" at 124 represents the propagation delay of clock signal CT1 through first branch 106 and arrow "S2", as indicated at 126, represents the propagation delay of clock signal CT2 through second branch 110 after application of stress engineering techniques.

As can be seen in FIG. 4, while the propagation delays S1 124 and S2 126 through first and second branches 106 and 110 with stress applied is less than propagation delays A 120 and A2 122, the difference D2 128 between propagation delays S1 122 and S2 124 is greater than the difference D1 130 between propagation delays A1 120 and A2 122. The most important aspect of clock distribution circuits, such as clock distribution circuit 100, is that the clock signals, such as clock signals CT1 and CT2, arrive at their associated flip-flops, such as flip-flops 114 and 116, at substantially the same time.

Therefore, even though the propagation delays associated with clock signals CT1 and CT2 are reduced due to the application of stress, the increased difference D2 128 in propagation delays between clock signals CT1 and CT2 creates greater uncertainty (i.e. less stability) in clock signals CT1 and CT2 than that present in the absence of the applied stress. While the speed improvement of clock signals CT1 and CT2 merely reduces clock latency, the increased difference D2 128 between propagations delays S1 124 and S2 126 increases clock jitter or clock uncertainty which directly reduces the speed and, thus, the performance of the integrated circuit.

Although the propagation delays A1 120 and A2 122 of clock signals CT1 and CT2 may be longer in the absence of applied stress merely influences latency, the signals are more stable and present less uncertainty. As such, while application of stress to the critical, sub-critical, and very short signal path constituents improves the performance of the integrated circuit, as described above, it is advantageous to omit or reduce the amount of stress applies to channel regions of transistors of clock hardware constituents relative to transistors of other types of circuit constituents.

Figure 5:
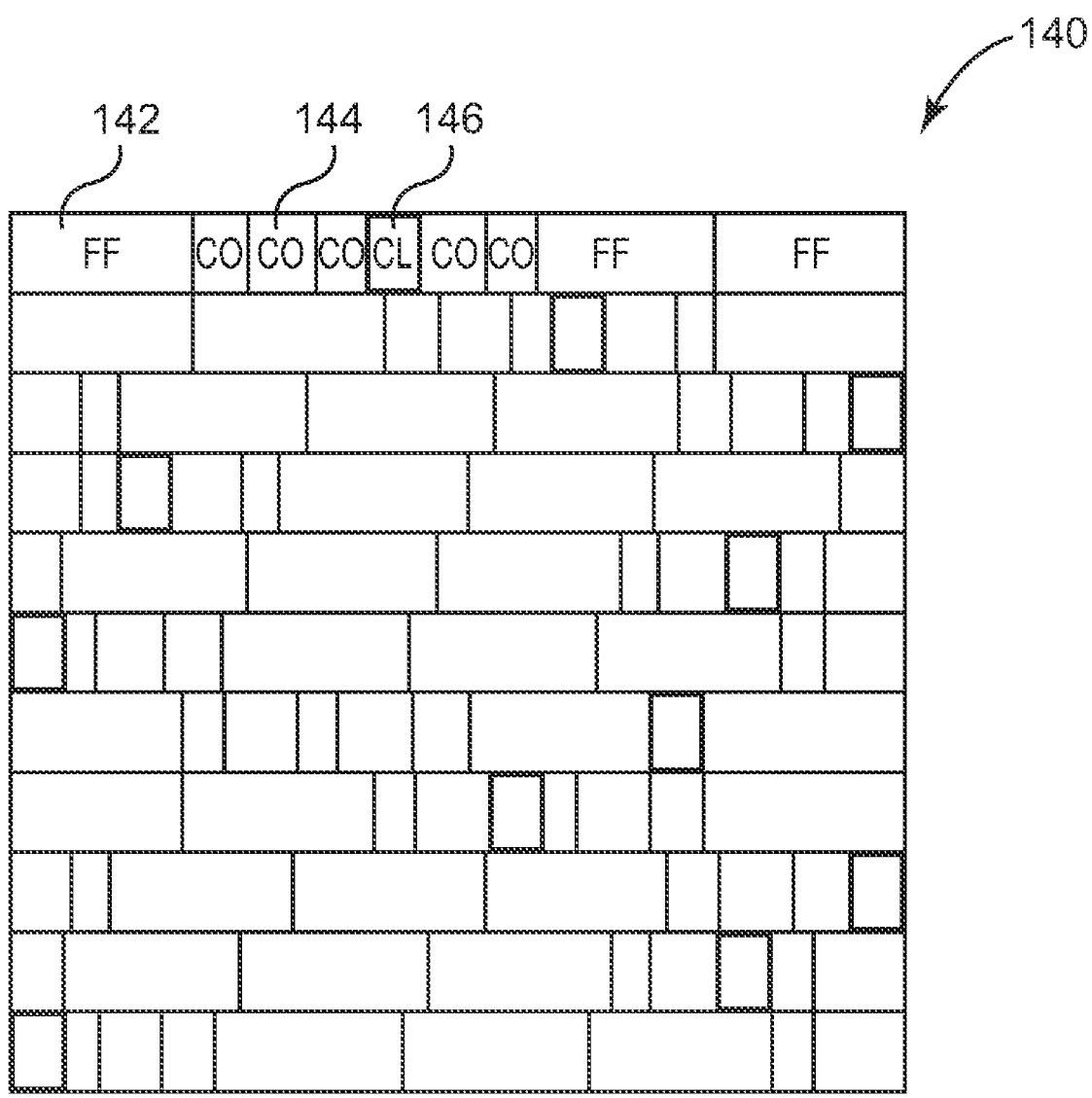
FIG. 5 is a block diagram illustrating an example of a floor plan of the cell layout of an integrated circuit.

FIG. 5 is a block diagram illustrating an example of a floor plan 140 of the cell layout of a custom or semi-custom integrated circuit, such as integrated circuit 30. Flip-flop cells are labeled with as "FF", such as indicated at 142, combinatorial cells are labeled as "CO", such as indicated at 144, and clock hardware cells are labeled as "CL" and are highlighted with "bold" lines, such as indicated at 146. It is noted that FF cells and CO cells are associated with critical, sub-critical, and very short signal paths.

Figure 6:
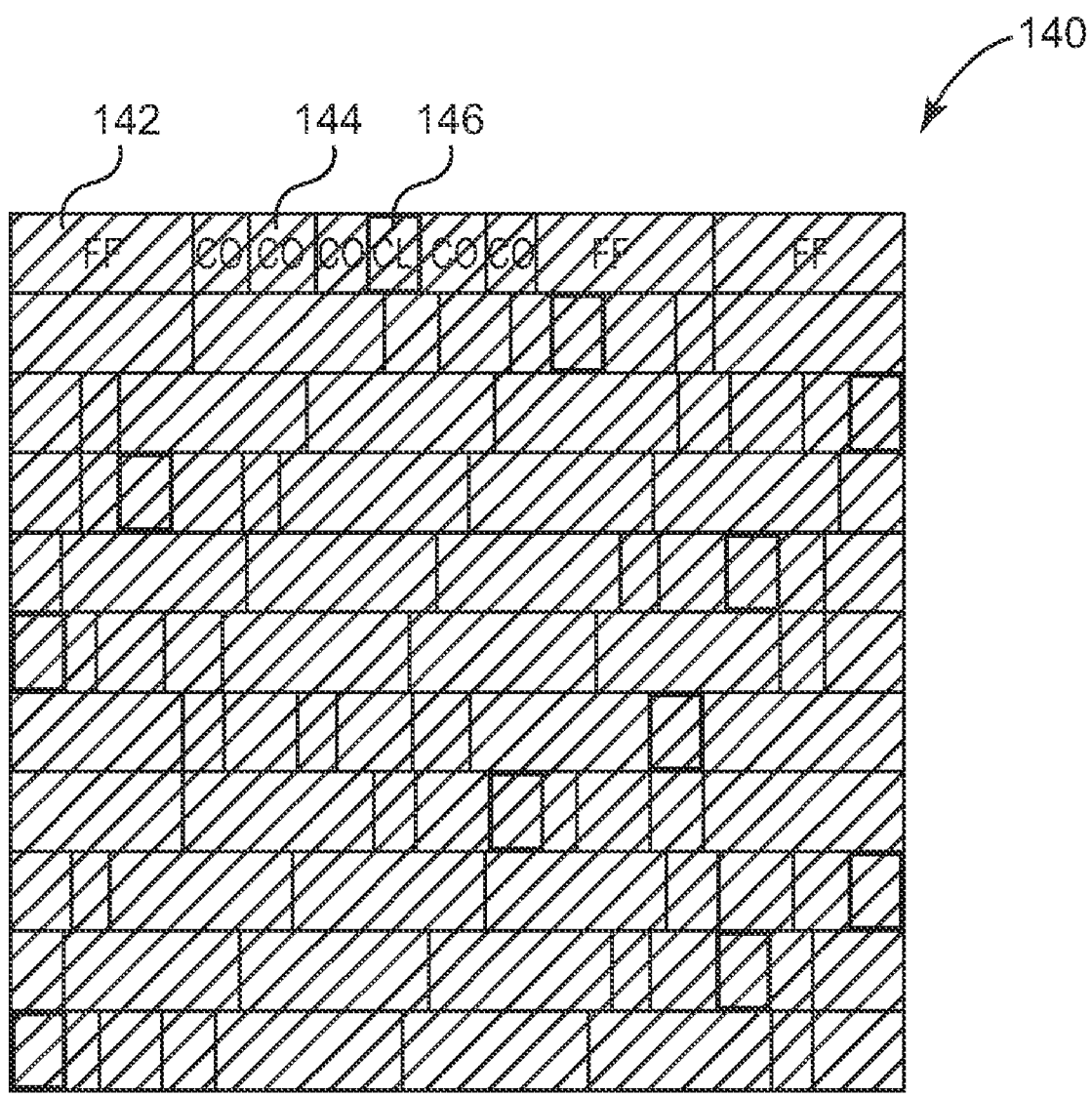
FIG. 6 is a block diagram illustrating an example of a floor plan of an integrated circuit employing conventional stress engineering techniques.

FIG. 6 is a block diagram illustrating floor plan 140 of FIG. 5 after application of conventional stress engineering processes. In FIG. 6, a blanket stress enhancement layer or liner, as indicated by the hatch lines, is illustrated as being deposited over all cells of floor plan 140. In one embodiment, the blanket stress liner comprises a nitride film. In another embodiment, the hatched rectangle indicates where the stress enhancement is a silicon-germanium (SiGe) material which is selectively deposited.

Figure 7:
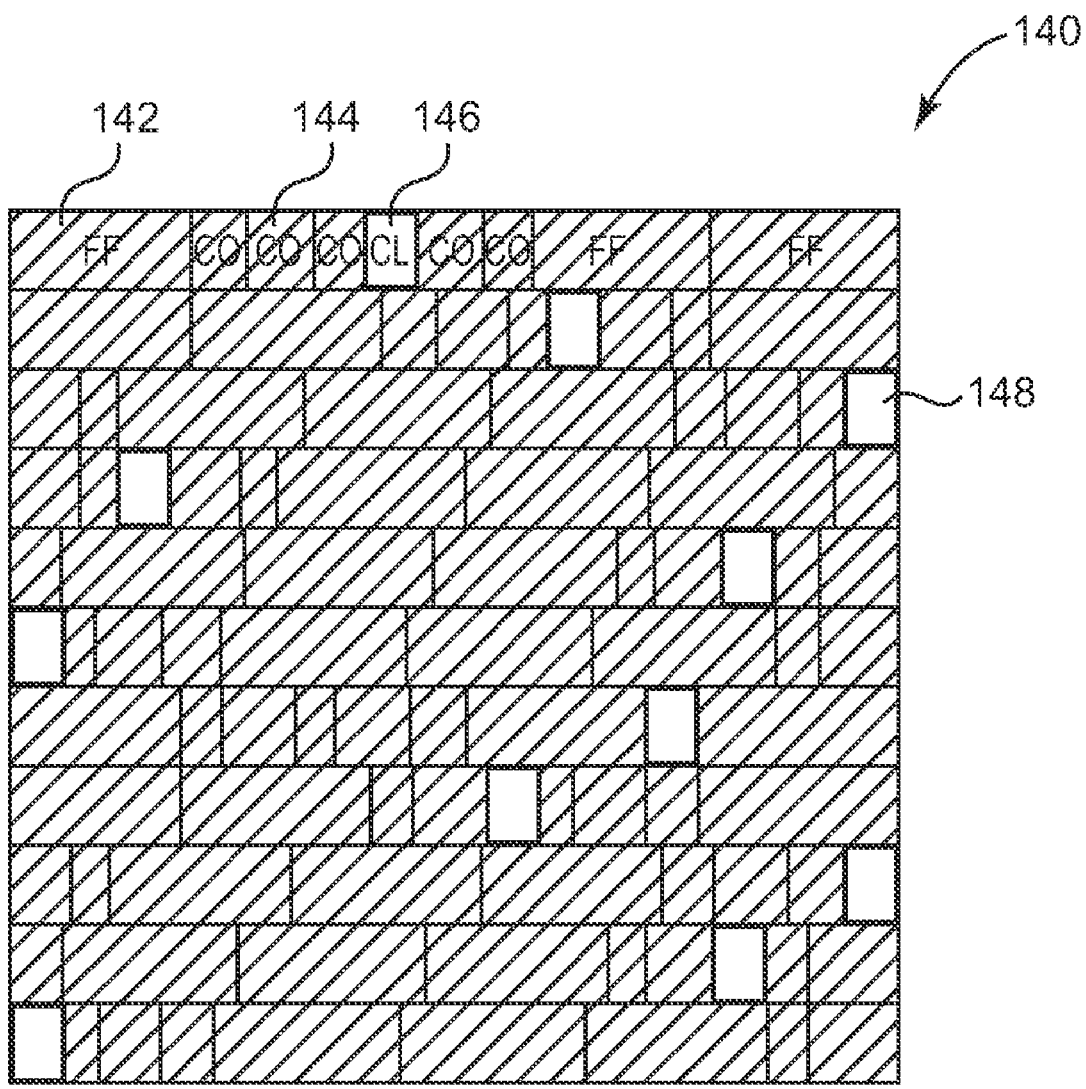
FIG. 7 is a block diagram illustrating the floor plan of FIG. 5 after application of stress engineering according to one embodiment.

However, as described in the above evaluation of clock hardware constituents with regard to FIG. 4, it is advantageous to omit the application of stress enhancement processes to clock hardware cells. As such, FIG. 7 is a block diagram illustrating floor plan 140 of FIG. 5 after application of stress engineering according to one embodiment. As illustrated by FIG. 7, during application of the blanket stress enhancement liner to floor plan 140, the stress enhancement liner is applied over all cells except clock hardware cells 146, as indicated by the absence of the hath lines at 146.

In one embodiment, for example, the blanket stress enhancement liner is applied over entire floor plan 140 and subsequently removed via a masking process from clock hardware cells 146. In another embodiment, for example, the blanket stress enhancement liner is blocked in some fashion from being applied over clock hardware cells 146 of floor plan 140.

FIGS. 8A-8D are cross-sections through three neighboring transistors of a portion of an example floor plan of an integrated circuit, with two of the transistors belonging to logic cells, as indicated by transistors 152 and 154, and one transistor belonging to a clock buffer, as indicated by transistor 156. Each transistor includes a gate, source, and drain, such as indicated by gate 158, source 160, and drain 162 of transistor 152. The neighboring transistors are isolated via STI, as indicated at 164.

Figure 8:
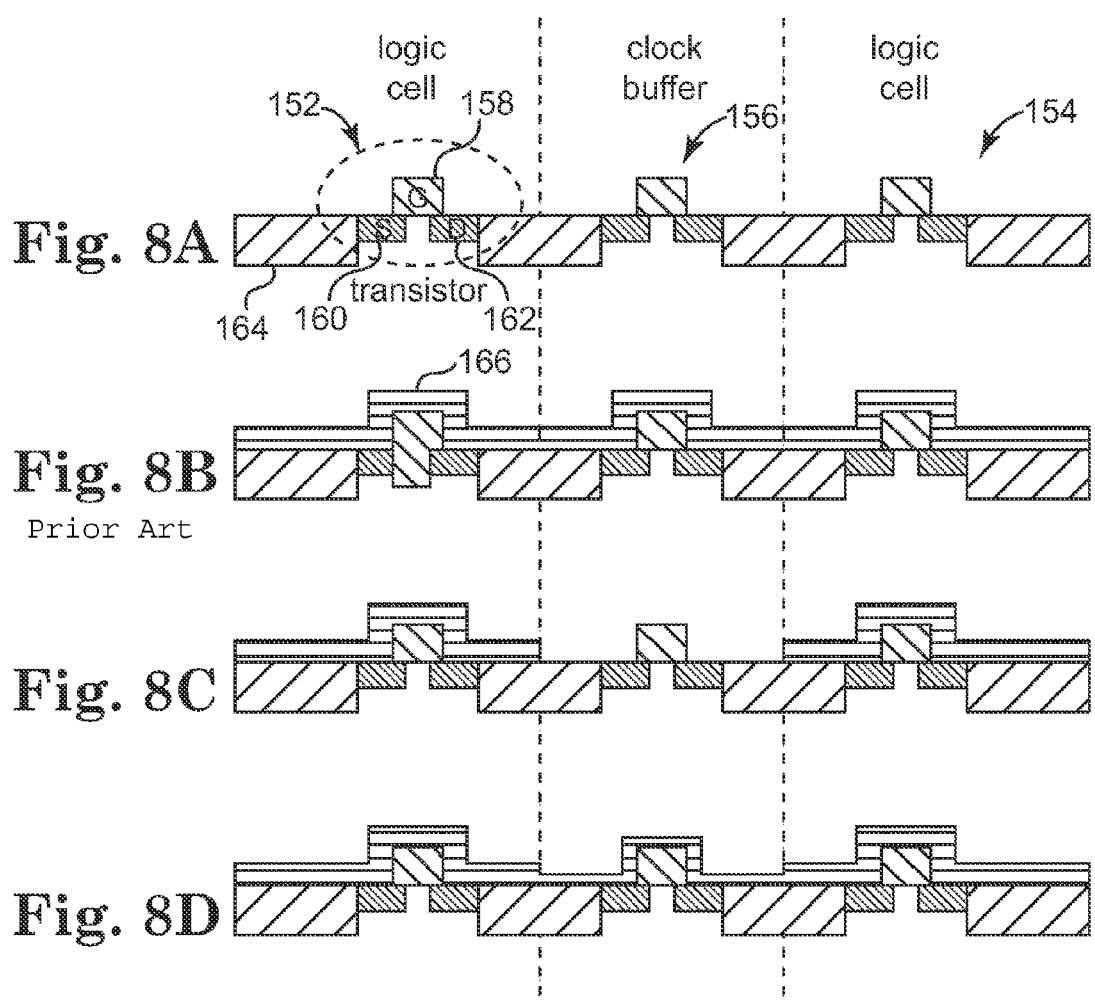
FIG. 8A is a cross-sectional view of a portion of a floor plan without stress engineering.
FIG. 8B is a cross-sectional view of a portion of a floor plan employing conventional stress enhancement.
FIG. 8C is a cross-sectional view of a portion of a floor plan employing stress enhancement according to one embodiment.
FIG. 8D is a cross-sectional view of a portion of a floor plan employing stress enhancement according to another embodiment.

FIG. 8A illustrates a case without stress engineering. FIG. 8B illustrates a case where a blanket stress layer 166 has been applied over the entire floor plan according to conventional stress engineering techniques.

FIGS. 8C and 8D illustrate stress engineering techniques according to embodiments described herein. FIG. 8C illustrates a scenario where blanket stress layer 166 is applied over the entire floor and is either prevented from being applied over or is locally removed around clock buffer transistor 156. FIG. 8D illustrates a scenario where blanket stress layer 166 is only locally thinned (not removed) around clock buffer transistor 156. Locally thinning stress layer 166 in this fashion leads to a substantial reduction of stress and corresponding variations. Locally thinning stress layer 166 in this fashion is especially suitable when stress layer 166 is used as an etch stop layer for any subsequent etch process, since the remaining portion or thinned portion of stress layer 166 can still be used as an etch stop.

Figure 9:
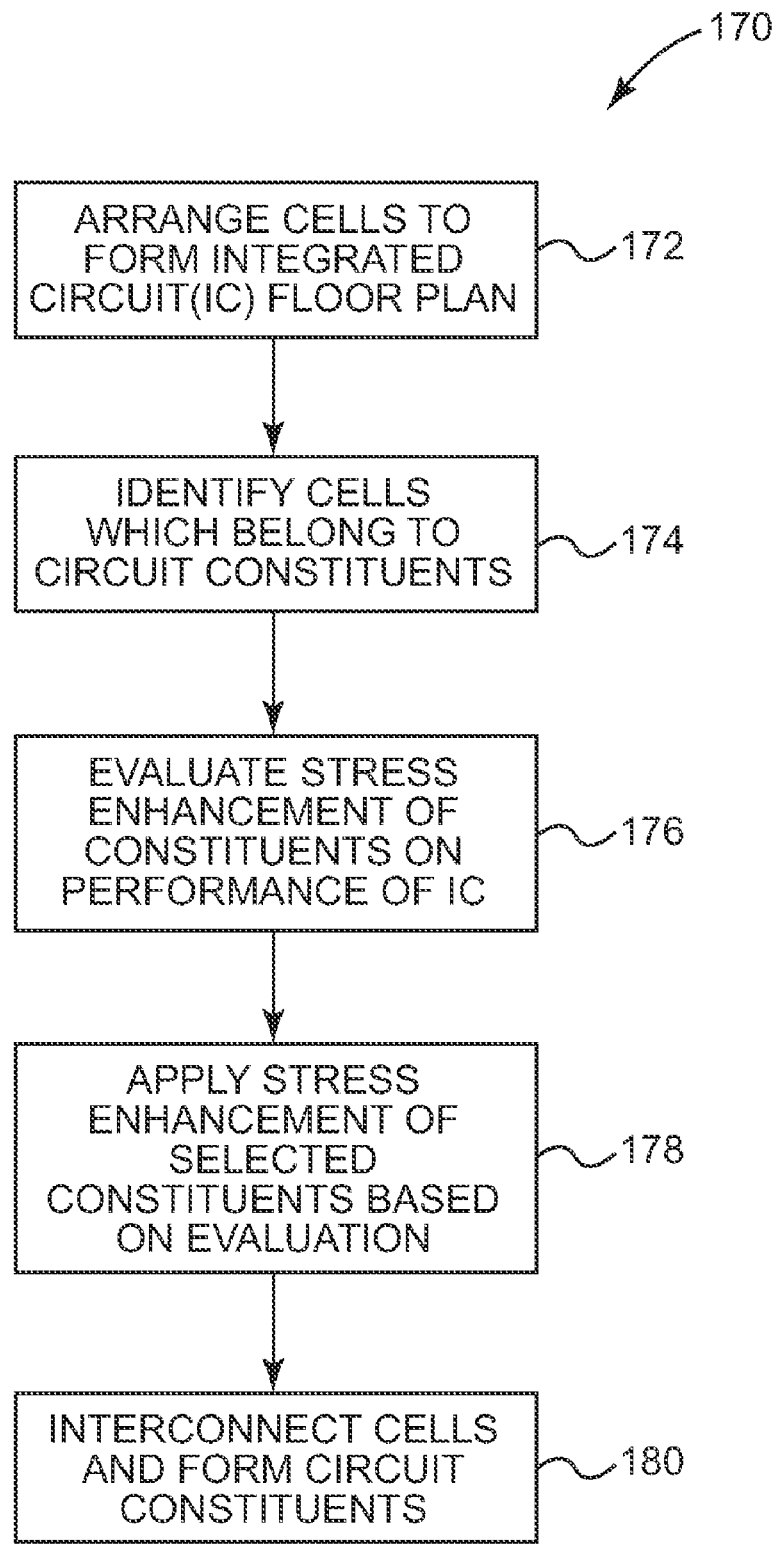
FIG. 9 is a flow diagram generally illustrating one embodiment of a stress engineering process

FIG. 9 is a flow diagram generally illustrating an integrated circuit fabrication process 170 including selective application of channel stress enhancement according to one embodiment. Process 170 begins at 172 where a plurality of selected standard cells, such as from a cell library, are arranged to form a desired floor plan of the integrated circuit, such as that illustrated by FIG. 5. At 164, the cells are identified as to which circuit constituent each cell will belong. Each circuit constituent has associated performance variations and each can be categorized as belonging to one of a number of circuit constituent types (e.g. critical path, sub-critical path, very short signal path, clock distribution hardware).

At 176, additional performance variations which are expected to result from application of mechanical stress to the channels of transistors of the cells are evaluated for each of the circuit constituent types, such as that described above with regard to the critical path, very short signal path, and clock distribution hardware constituents of FIGS. 2 through 4. At 178, stress enhancement is applied to the channels of transistors of cells based on the circuit constituent type of the circuit constituent to which the cell belongs and on the evaluation at 176. For example, as described above with regard to FIG. 4, stress enhancement of clock distribution hardware results in an increase in clock uncertainty (i.e. jitter). As such, in one embodiment, stress enhancement is provided to channels of transistors of all cells except those associated with clock distribution hardware constituents. At 180, the cells are interconnected to form a plurality of circuit constituents which, together, are configured to perform desired functions of the integrated circuit.

It is noted that suitable stress enhancement processes other than blanket stress liner techniques, as described briefly above, may be employed to apply stress enhancement to integrated circuit cells. These other suitable stress enhancement processes, such as implantation of silicon-germanium in the source and drain regions of transistors, for example, can be adapted as required to provide selective application of stress enhancement to cells of the integrated circuit.

In summary, by selectively applying strain enhancement techniques to only those cells of selected circuit constituents according to embodiments described herein, improvements in performance (e.g. speed) of the integrated circuit are achieved without the detracting effects that would otherwise be caused by the additionally variations resulting from global stress enhancement of the integrated circuit components.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating an integrated circuit, the method comprising:
    arranging a plurality of cells to form a desired floor plan of the integrated circuit, each cell comprising at least one transistor;
    forming a plurality of circuit constituents from the plurality of cells of the floor plan, each circuit constituent comprising at least one cell and belonging to one of a plurality circuit constituent types; and
    applying a mechanical stress to channel regions of the at least one transistor of each cell based on the circuit constituent type of the circuit constituent to which the cell belongs, including applying the mechanical stress at a first level to cells of circuit constituents belonging to a first portion of the circuit constituent types, and applying the mechanical stress at a second level to cells of circuit constituents belonging to a second portion of the circuit constituent types, wherein the second level is greater than the first level.

2. The method of claim 1, wherein applying mechanical stress includes:

applying a stress liner at a first thickness over the cells of circuit constituents belonging to the first portion of the circuit constituent types; and applying a stress liner at a second thickness over the cells of circuit constituents belonging to the second portion of the circuit constituent types, wherein the second thickness is greater than the first thickness.

3. The method of claim 1, wherein the first portion of circuit constituent types comprises a clock distribution hardware constituent and the second portion of circuit constituent types comprises a remaining portion of circuit constituent types.

4. The method of claim 1, wherein applying mechanical stress comprises deposition of silicon-germanium in source and drain regions of the transistors of the cells.

5. The method of claim 1, wherein each circuit constituent type has associated performance variations, and wherein applying mechanical stress includes:

evaluating additional performance variations of each circuit constituent type expected to result from application of mechanical stress to the channel regions of the transistors of the cells thereof and the effect of the additional variations on performance of the integrated circuit; and applying mechanical stress at the first level to transistors of circuit constituent types having additional expected performance variations that do not adversely affect performance of the integrated circuit, and at the second level to transistors of circuit constituent types having additional expected performance variations adverse to performance of the integrated circuit.

6. The method of claim 1, wherein performance variations include at least path delay uncertainties associated with the circuit constituent types.

7. The method of claim 1, wherein the plurality of circuit constituent types includes a very short signal path constituent, and wherein the method includes adding buffers as necessary to short signal path constituents to eliminate hold time variations which would otherwise result from performance enhancements due to application of mechanical stress to channel regions of transistors of the cells of the very short signal path constituents.

8. The method of claim 1, wherein the circuit constituent types include critical paths.

9. The method of claim 1, wherein the circuit constituent types include sub-critical paths.

10. The method of claim 1, wherein the integrated circuit comprises an integrated logic circuit.

11. An integrated circuit comprising:

a plurality of cells arranged to form a desired floor plan, with each cell belonging to one of a plurality of circuit constituent types; and a stress liner deposited over all cells of the floor plan and having a first thickness over cells belonging to a first portion of the plurality of circuit constituent types and a second thickness over cells belonging to second portion of the plurality of circuit constituent types, wherein the first thickness is greater than the second thickness.

12. The integrated circuit of claim 11, wherein the second portion of the plurality of circuit constituent types comprises a clock distribution hardware constituent type.

13. The integrated circuit of claim 11, wherein the integrated circuit comprises an integrated logic circuit.

14. A method of configuring an integrated logic circuit, the method comprising:

arranging a plurality of selected standard cells to form a desired floor plan of the logic circuit, wherein each cell includes a plurality of transistors;

interconnecting the selected standard cells to form a plurality of circuit constituents which together are configured to perform desired functions of the logic circuit, each circuit constituent having associated performance variations, and each circuit constituent belonging to one of a plurality of circuit constituent types;

evaluating additional performance variations for each of the plurality of circuit constituent types which are expected to result from application of mechanical stress to transistors of the corresponding cells; and applying mechanical stress at varying levels to the channels of transistors of cells of circuit constituent types based on the evaluating.

15. The method of claim 14, wherein the evaluating includes determining additional delay uncertainties of circuit constituent types expected to result from application of mechanical stress to transistors of the corresponding cells.

16. The method of claim 14, wherein circuit constituent types include critical paths comprising register cells and combinatorial cells.

17. The method of claim 14, wherein circuit constituent types include clock distribution hardware constituents.

18. The method of claim 14, wherein the plurality of circuit constituent types includes a very short signal path constituent, and wherein the method includes adding buffers as necessary to short signal path constituents to eliminate hold time variations which would otherwise result from performance enhancements due to application of mechanical stress to channel regions of transistors of the cells of the very short signal path constituents.

19. A method of fabricating an integrated circuit, the method comprising:

arranging a plurality of cells to form a desired floor plan of the integrated circuit, each cell comprising at least one transistor;

forming a plurality of circuit constituents from the plurality of cells of the floor plan, each circuit constituent comprising at least one cell and belonging to one of a plurality circuit constituent types;

applying a first type of mechanical stress at a first level to cells of circuit constituents belonging to a first portion of the circuit constituent types; and applying the first type mechanical stress at a second level to cells of circuit constituents belonging to a second portion of the circuit constituent types, wherein the second level is greater than the first level.

20. The method of claim 19, wherein the first type of mechanical stress comprises a compressive stress.

21. The method of claim 19, wherein the first type of mechanical stress comprises a tensile stress.

* * * * *